(12) United States Patent
Eskola et al.

(10) Patent No.: US 9,188,648 B2
(45) Date of Patent: Nov. 17, 2015

(54) METHOD AND ARRANGEMENT FOR DETERMINING INDUCTANCES OF SYNCHRONOUS RELUCTANCE MACHINE

(75) Inventors: Matti Eskola, Espoo (FI); Matti Veijanen, Espoo (FI)

(73) Assignee: ABB TECHNOLOGY OY, Helsinki (FI)

( * ) Notice: Subject to any disclaimer, the term of this patent is extended or adjusted under 35 U.S.C. 154(b) by 976 days.

(21) Appl. No.: 13/297,051

(22) Filed: Nov. 15, 2011

(65) Prior Publication Data
US 2012/0123715 A1 May 17, 2012

(30) Foreign Application Priority Data

Nov. 15, 2010 (EP) ..................................... 10191137

(51) Int. Cl.
*G06F 17/40* (2006.01)
*G06F 19/00* (2011.01)
(Continued)

(52) U.S. Cl.
CPC ............ *G01R 31/34* (2013.01); *G01R 27/2611* (2013.01); *G06F 17/40* (2013.01); *G06F 19/00* (2013.01)

(58) Field of Classification Search
CPC ................ F16P 3/00; F16P 7/00; G01D 7/00; G01D 9/00; G01D 21/00; G01R 15/00; G01R 27/00; G01R 27/02; G01R 27/08; G01R 27/26; G01R 27/2611; G01R 31/00; G01R 31/34; G01R 31/346; G01R 33/00; G01R 33/02; G06F 11/00; G06F 11/30; G06F 11/32; G06F 11/34; G06F 15/00; G06F 15/16; G06F 17/00; G06F 17/10; G06F 17/40; G06F 19/00; H02P 29/00; H02P 2209/00

USPC .......... 73/432.1, 865.8, 865.9, 866.3; 318/34, 318/432, 490, 700, 716, 717, 720; 324/500, 324/511, 537, 545, 546, 600, 765.01; 340/500, 540, 635, 648, 653, 657, 679; 702/1, 57, 64, 65, 127, 182, 187, 189; 708/100, 105, 200
See application file for complete search history.

(56) References Cited

U.S. PATENT DOCUMENTS 3,909,687 A * 9/1975 Abbondanti ................... 318/805
8,063,598 B2 * 11/2011 Stoiber et al. ............ 318/400.33
(Continued)

FOREIGN PATENT DOCUMENTS

CN    101192808 A * 6/2008

OTHER PUBLICATIONS

Search report for Application No. No. 201110370202.1 by State Intellectual Property Office of People's Republic of China Jan. 26, 2014.*
(Continued)

*Primary Examiner* — Edward Cosimano
(74) *Attorney, Agent, or Firm* — Buchanan Ingersoll & Rooney PC

(57) ABSTRACT

A method and an arrangement of determining inductances of a synchronous reluctance machine are provided. The method includes supplying a voltage pulse in the quadrature-axis or direct-axis direction of rotor, sampling currents generated by the supplied voltage pulse, and calculating values of flux at the sampling instants from the value of the supplied voltage pulse, the sampled current values and a value of the stator resistance. The method also includes calculating synchronous inductance of the machine by dividing the calculated flux values by the corresponding sampled currents, and/or calculating transient inductance of the machine as a derivative of the flux with respect to current, and storing the calculated values as a function of current.

21 Claims, 5 Drawing Sheets

(51) Int. Cl.
*G01R 31/34* (2006.01)
*G01R 27/26* (2006.01)

(56) References Cited

U.S. PATENT DOCUMENTS

| | | | |
|---|---|---|---|
| 8,742,767 B2* | 6/2014 | Messersmith et al. | 324/546 |
| 2008/0129243 A1 | 6/2008 | Nashiki | |
| 2009/0115425 A1 | 5/2009 | Zeh | |
| 2009/0237014 A1* | 9/2009 | Yamada | 318/400.02 |
| 2009/0261765 A1* | 10/2009 | Stoiber et al. | 318/400.33 |
| 2011/0102012 A1* | 5/2011 | Messersmith et al. | 324/765.01 |
| 2013/0096865 A1* | 4/2013 | Gao et al. | 702/108 |
| 2014/0285230 A1* | 9/2014 | Messersmith et al. | 324/765.01 |

OTHER PUBLICATIONS

European Search Report for EP 10191137 dated Apr. 7, 2011.
N. Ben-Hail et al., "Inductance Measurements in Switched Reluctance Machines," IEEE Transactions on Magnetics, Apr. 2005, pp. 1296-1299, vol. 41, No. 4.
O. Ustun, "Measurement and Real-Time Modeling of Inductance and Flux Linkage in Switched Reluctance Motors," IEEE Transactions on Magnetics, Dec. 2009, vol. 45, No. 12.
An English Translation of the Office Action (Notification of the First Office Action) issued on Jan. 26, 2014, by the Chinese Patent Office in corresponding Chinese Patent Application No. 201110370202.1. (9 pages).

* cited by examiner

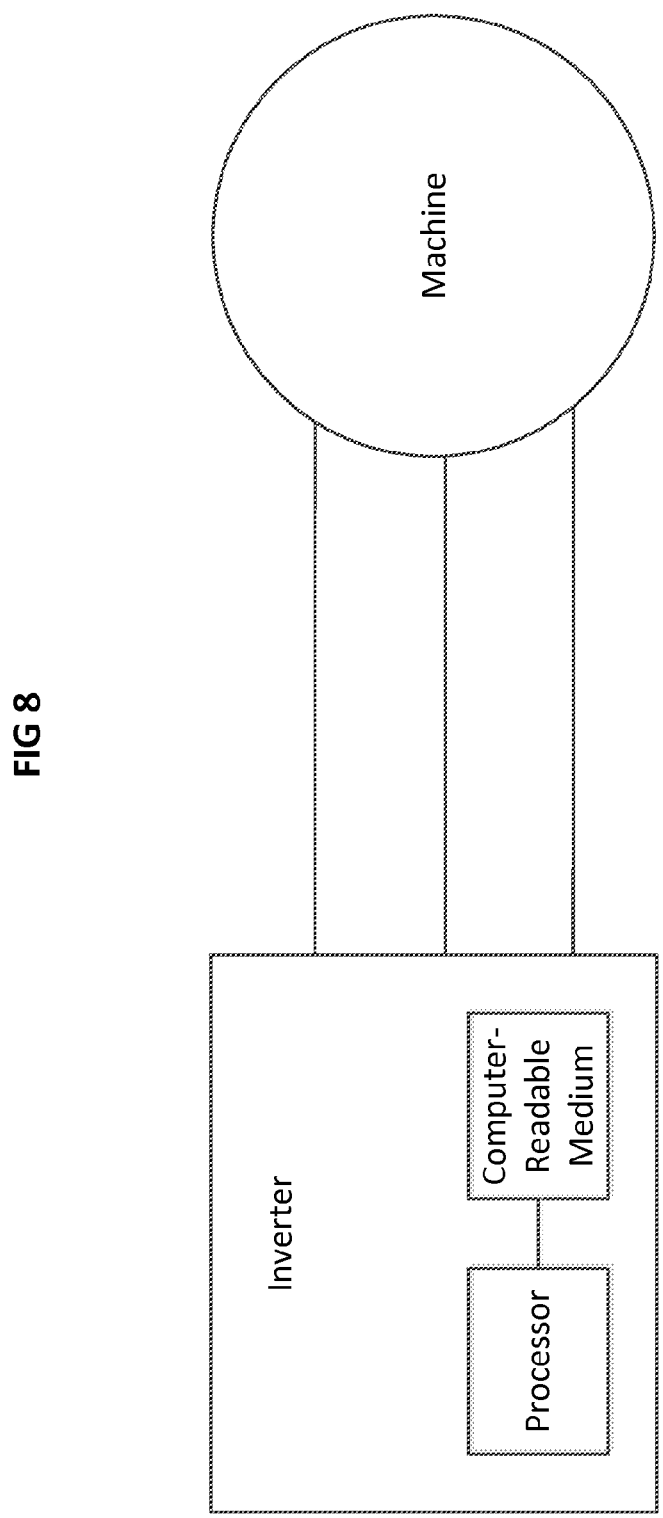

METHOD AND ARRANGEMENT FOR DETERMINING INDUCTANCES OF SYNCHRONOUS RELUCTANCE MACHINE

RELATED APPLICATION

This application claims priority under 35 U.S.C. §119 to European Patent Application No. 10191137.8 filed in Europe on Nov. 15, 2010, the entire content of which is hereby incorporated by reference in its entirety.

FIELD

The present disclosure relates to reluctance machines, and more particularly, to determining the inductance properties of reluctance machines.

BACKGROUND INFORMATION

Attempts are often made to control electric motor drives as efficiently as possible. This means at its simplest that at a given load torque the current drawn by the motor is minimized. This minimizes the resistive losses in the motor. The minimization of current would be an easy task if the machine were ideal. In practice, however, the magnetic saturation of the iron parts of the machine makes the search for an ideal operation point a demanding process. Due to the saturation effect, the inductances of the machine are not constant, but change as a function of the stator current. The fact that inductances change as a function of the stator current makes the optimization of the production of torque a difficult task, because in alternating current machines the inductances have an influence on the magnitude of torque.

In order to maximize the torque with a given stator current during the operation of the drive, the behavior of the inductances should be known as a function of current or flux. The inductance behavior is also important for the operation of control of synchronous reluctance machines, especially if the machine is controlled without a measured rotor speed and position. Such open-loop control methods estimate the rotor position by using a mathematical model of the machine. In connection with synchronous reluctance machines, the open-loop control does not operate correctly if the saturation of the inductances is not properly taken into account.

In known inductance identification procedures, the rotor has to be rotated. Due to this requirement, at least in some processes, the identification must be carried out before the machine is coupled to the process. Further, in the methods in which the rotor is rotated, the time for carrying out the identification is long. In some inductance identification procedures, the synchronous reluctance motor has to be loaded. The application of load torque to the machine to be identified can be cumbersome, especially if the machine is already at the facilities of the end user.

SUMMARY

An exemplary embodiment of the present disclosure provides a method of determining inductances of a synchronous reluctance machine. The exemplary method includes supplying a voltage pulse in the quadrature-axis or direct-axis direction of a rotor, sampling currents generated by the supplied voltage pulse, and calculating values of flux at instants of the sampling from the value of the supplied voltage pulse, values of the sampled current, and a value of a stator resistance. The exemplary method also includes calculating at least one of (i) a synchronous inductance of the machine by dividing the calculated flux values by the corresponding sampled currents, and (ii) a transient inductance of the machine as a derivative of the flux with respect to current. In addition, the exemplary method includes storing the calculated values as a function of current.

An exemplary embodiment of the present disclosure provides an arrangement of determining inductances of a synchronous reluctance machine. The exemplary arrangement includes means for supplying a voltage pulse in the quadrature-axis or direct-axis direction of a rotor, means for sampling currents generated by the supplied voltage pulse, and means for calculating values of flux at instances of the sampling from the value of the supplied voltage pulse, values of the sampled current, and a value of a stator resistance. The exemplary arrangement also includes means for calculating at least one of (i) synchronous inductance of the machine by dividing the calculated flux values by the corresponding sampled currents, and (ii) transient inductance of the machine as a derivative of the flux with respect to current. The exemplary arrangement also includes means for storing the calculated values as a function of current.

An exemplary embodiment of the present disclosure provides a non-transitory computer-readable recording medium having a program recorded thereon that causes a processor of a computer processing device to determine inductances of a synchronous reluctance machine. The program causes the processor to carry out operations including: supplying a voltage pulse in the quadrature-axis or direct-axis direction of a rotor; sampling currents generated by the supplied voltage pulse; calculating values of flux at instants of the sampling from the value of the supplied voltage pulse, values of the sampled current, and a value of a stator resistance; calculating at least one of (i) a synchronous inductance of the machine by dividing the calculated flux values by the corresponding sampled currents, and (ii) a transient inductance of the machine as a derivative of the flux with respect to current; and storing the calculated values as a function of current.

BRIEF DESCRIPTION OF THE DRAWINGS

Additional refinements, advantages and features of the present disclosure are described in more detail below with reference to exemplary embodiments illustrated in the drawings, in which:

FIG. 8 illustrates an example of an arrangement for determining inductances of a synchronous reluctance machine according to an exemplary embodiment of the present disclosure.

DETAILED DESCRIPTION

Exemplary embodiments of the present disclosure provide a method and an arrangement of determining inductances of a synchronous reluctance machine. The exemplary method and arrangement solve the problems noted above with respect to known techniques.

In accordance with an exemplary embodiment of the present disclosure, the saturation behavior of inductances of synchronous reluctance machines is determined with different pulse tests using an inverter connected to the machine. Both synchronous inductances and transient inductances of the synchronous reluctance machine can be determined using a series of pulse tests. FIG. 8 illustrates an inverter controlling a machine (e.g., a motor) as an exemplary embodiment of an arrangement for determining inductances of a synchronous reluctance machine.

Figure 7:
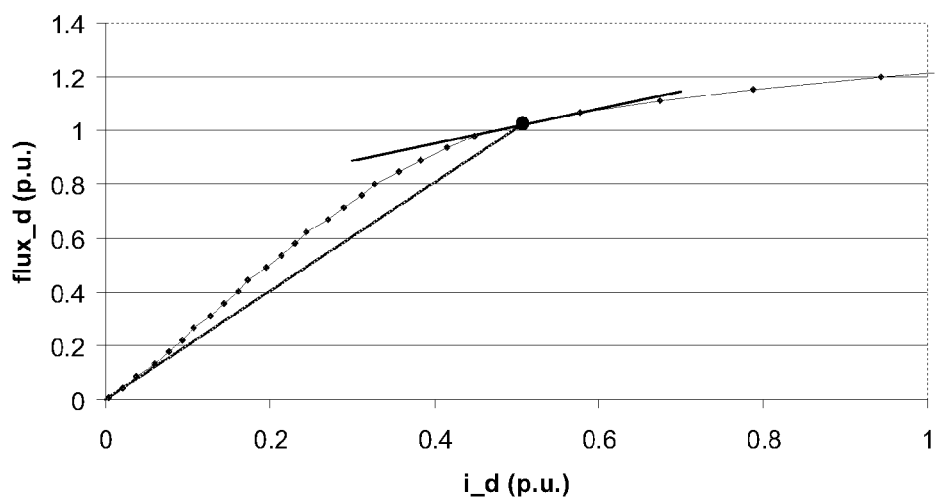
FIG. 7 illustrates a determination of synchronous and transient inductances according to an exemplary embodiment of the present disclosure.

Synchronous and transient inductances are illustrated in FIG. 7, which shows a graph obtained during inductance measurement. Flux is plotted as a function of measured current. Synchronous inductance is the slope of the line that is drawn from the origin to a selected point of the curve, e.g., to a point, the inductance of which is of interest. This is a well-known relation: Flux=current*inductance. Transient inductance is the derivative of the flux as a function of current at a given operating point. In FIG. 7, this is illustrated by a tangent line drawn at a selected point of the curve. Transient inductance describes the behavior of the current in the neighborhood of a certain operating point.

In accordance with an exemplary embodiment, the method of the present disclosure does not require any additional equipment since it can be carried out using an inverter controlling the machine. The inductance values obtained with the method can be directly loaded to the inverter controlling the measured reluctance machine. The method of the present disclosure does not require the rotation of the machine. In accordance with an exemplary embodiment, the rotor is slightly rotated for aligning the rotor. In case the direction of the rotor is known, the method can be carried out without any rotational movement of the rotor. Since the rotor of the machine is not rotated, the method is fast.

Due to the nature of reluctance machines, stator currents have a considerable influence on the saturation of the inductances. The method provides accurate information on the saturation behavior. Once the accurate saturation behavior is adapted to use in a motor model of the inverter or frequency converter controlling the machine, the control of the synchronous machine is accurate and reliable.

In accordance with an exemplary embodiment of the method of the present disclosure, the saturation behavior of inductances of a synchronous reluctance machine is measured using simple pulse tests. In known methods, pulse tests are used to measure only the transient behavior of the inductances of an AC motor.

In the following, the synchronous reluctance machine is referred to as synchronous reluctance motor or simply a reluctance motor. It is, however, apparent that a similar synchronous machine can be operated as a motor or as a generator.

Figure 1:
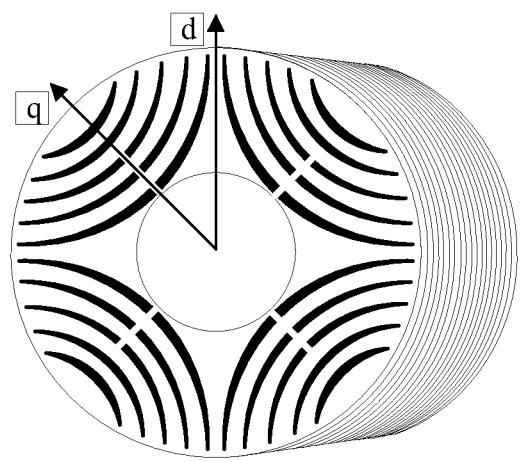
FIG. 1 shows a simplified structure of a rotor of a synchronous reluctance machine according to an exemplary embodiment of the present disclosure.

A synchronous motor is said to be a salient pole motor if the direct-axis and quadrature-axis inductances are clearly different in magnitude. Here, the direct-axis inductance is marked as Ld and quadrature-axis inductance as Lq. The direction of the d-axis in a reluctance motor is selected to be the direction of the highest inductance. FIG. 1 schematically shows one example of a rotor structure of a reluctance machine with the directions of the d- and q-axes.

In an ideal situation, the torque produced by a synchronous machine can be expressed as:

$$T = \psi_{rotor} i_q + (L_d + L_q) i_d i_q \quad (1)$$

where $\psi_{rotor}$ is the flux produced by rotor permanent magnets or rotor windings, and id, iq and Ld, Lq are the direct and quadrature components of current and inductance. As known, reluctance motors do not have permanent magnets or windings in the rotor, so the expression for torque is simplified to the form:

$$T = (L_d(i_d,i_q) + L_q(i_d,i_q)) i_d i_q \quad (2)$$

The above equation (2) may seem simple, but actually the inductances in the d- and q-direction are dependent on currents in both the direct and the quadrature directions, which makes the optimization of currents difficult. If Ld and Lq were constants, it would be easy to show that the torque is at the maximum with a given current vector length when iq equals id. When iq and id are equal in magnitude, the current angle is 45°. In practice, however, the current angle is greater than 45°. When the current vector increases, the d-direction of the rotor saturates more than the q-direction, and the inductance difference Ld−Lq diminishes if the angle is fixed to 45°. When the torque grows, the current angle has to be made larger because the q- and d-inductances saturate at a different pace. The increase of the current angle means, in other words, that the current in the direction of the q-axis is made greater than the current in the d-direction.

D-axis current naturally saturates the iron in the d-axis direction and q-axis current in the q-axis direction, respectively. Since the fluxes in the d- and q-direction flow in the same iron parts, the flux of the d-direction saturates the iron of the q-direction, and vice versa. This means that the d- and q-directions cannot be considered separately as in most equivalent circuit representations. The effect of quadrature-axis current on the direct-axis inductance and direct-axis current on the quadrature-axis inductance is herein referred to as cross saturation.

Figure 2:
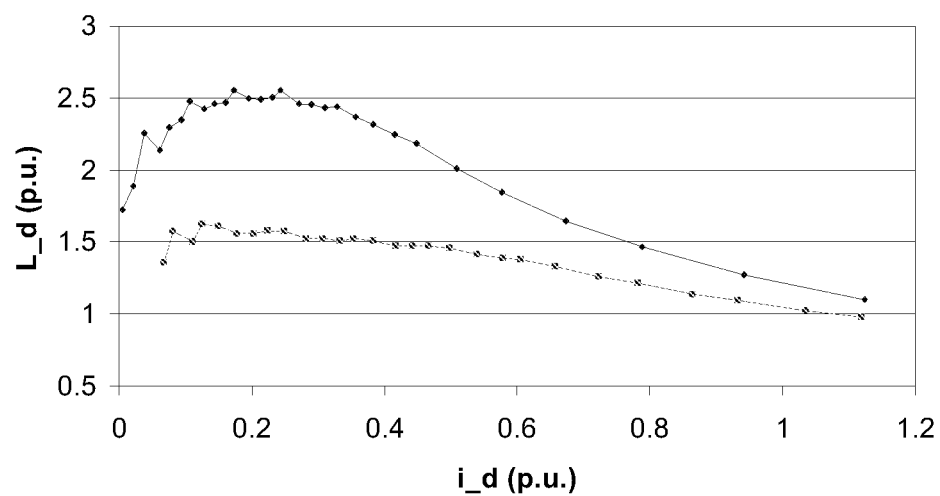
FIG. 2 shows measured inductances in the d-direction of the rotor according to an exemplary embodiment of the present disclosure.
Figure 3:
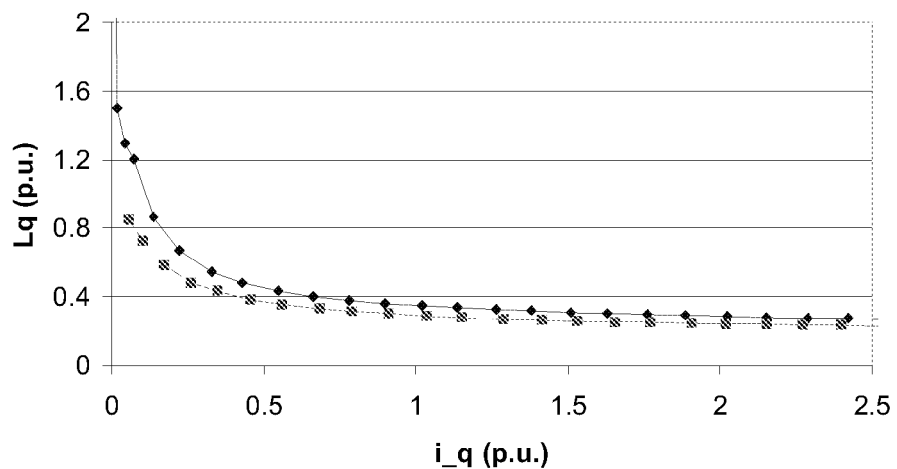
FIG. 3 shows measured inductances in the q-direction of the rotor according to an exemplary embodiment of the present disclosure.

The saturation of a synchronous reluctance machine is illustrated in FIGS. 2 and 3. FIGS. 2 and 3 show direct-axis inductance Ld and quadrature-axis inductance Lq as a function of direct-axis and quadrature-axis currents id, iq. The measurements of the inductances are carried out by a real machine with the method that will be explained below. It can be seen from FIGS. 2 and 3 that the inductances vary greatly depending on the current. The cross saturation has a noticeable influence on the d-direction. With small id values, the value of Ld can decrease as much as tens of percents when iq increases from zero to a considerable value.

Figure 4:
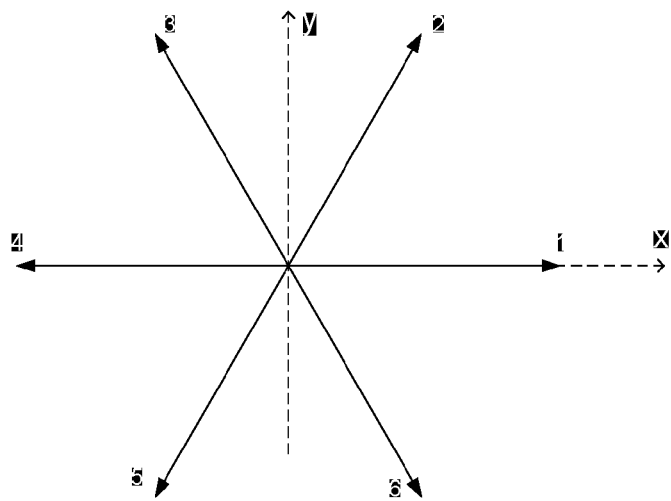
FIG. 4 shows a voltage vector diagram and a stator reference frame according to an exemplary embodiment of the present disclosure.

Six active voltage vectors are available from a two-level voltage source inverter or a frequency converter. These voltage vectors are shown in FIG. 4 in a stator reference frame with axes x and y, in which x denotes the real axis and y denotes the imaginary axis. The inverter and the available voltage vectors are employed in the method of determining the inductances of the reluctance motor.

Figure 5:
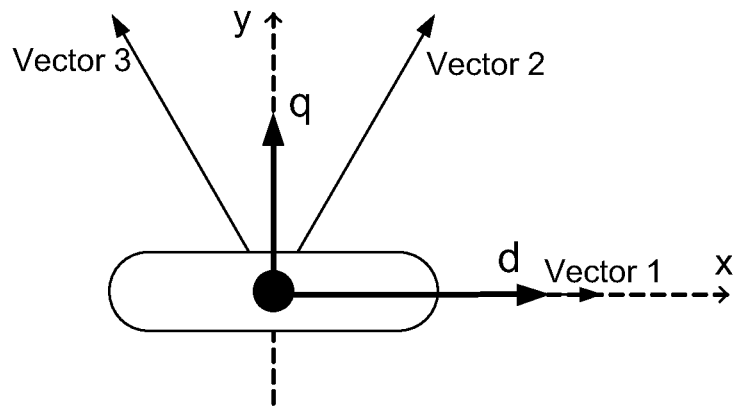
FIG. 5 shows an example of a rotor position in measuring inductance in the d-axis direction according to an exemplary embodiment of the present disclosure.

First, the inductance in the d-axis direction is measured without cross saturation, e.g., iq=0. In the measurement sequence, a DC current is first fed to the stator of the machine such that the d-axis of the rotor is aligned in a known direction. This known direction may be, for example, a direction of one of the voltage vectors. In FIG. 5, the rotor is aligned such that its d-axis is aligned with the direction of a voltage vector 1. This alignment is simply obtained by using the voltage vector 1. After the rotor is turned, the vector 1 is applied again. Now all voltage is over the d-direction and current id starts to grow.

While the voltage is applied, the current is sampled at a substantially high rate. Although the DC-link voltage is basically constant and known, it is advisable to also sample the voltage. When the current has risen to a sufficiently high value, the voltage pulse is stopped. After the pulse, the measured currents and voltages are available and stored, for example, to an easily accessible table. If the stator resistance is known, the flux can be calculated as:

$$\Psi(k) = \Psi(k-1) + \frac{t_{sample}}{2}\left(\begin{array}{c}(u(k) - Ri(k)) + \\ (u(k-1) - Ri(k-1))\end{array}\right). \quad (3)$$

Equation (3) is the integral of $(u_x - Ri_x)$ in discrete form using the Tustin approximation. Equation (3) produces a value for flux at each time step k which corresponds to the time instants in which the currents were measured.

When the calculated flux values are divided by the corresponding sampled current values, the upper plot of FIG. 2 is obtained, which shows the inductance in the d-axis direction without any current in the direction of the q-axis.

Figure 6:
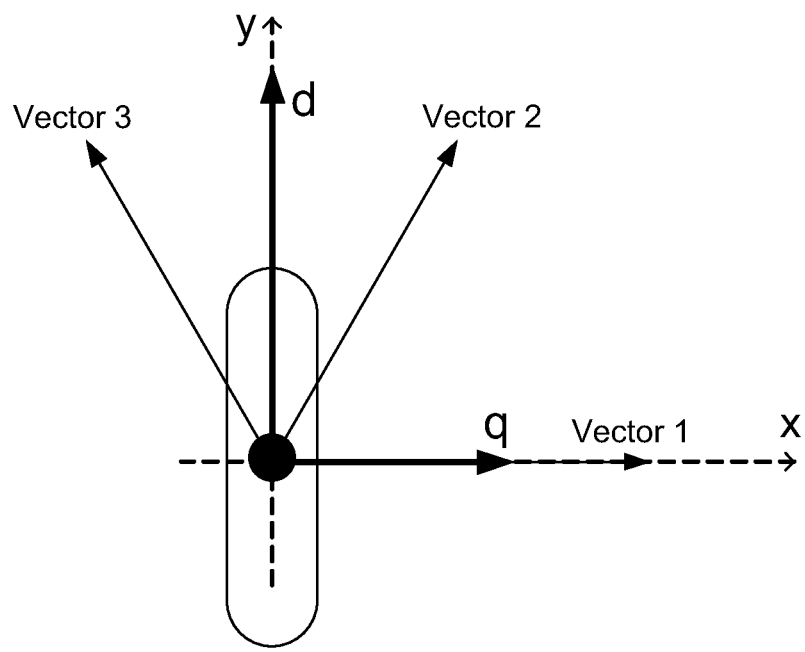
FIG. 6 shows an example of rotor position in measuring inductance in the q-axis direction according to an exemplary embodiment of the present disclosure.

The estimation of the inductance behavior continues with a second measurement, in which the inductance in the q-axis direction is determined. Before the measurement voltage pulse, the rotor is again aligned with a DC current such that the d-axis of the rotor is in an angle of 90 degrees to a known direction, such as the x-axis in the stator reference frame, as shown in FIG. 6. Now the voltage vector 1 can be used again, and the current only grows in the direction of the q-axis. The calculation of the inductance is carried out as described above with the d-axis inductance, and the result is plotted in the upper plot of FIG. 3.

In the third measurement, cross saturation effects are taken into consideration. In accordance with an exemplary embodiment, for the measurement of the inductance with cross saturation, the direct or quadrature component of the current has to be controlled, since the intention is to keep the cross saturating current at a fixed level and apply the voltage pulse as in the previous tests. For the measurement of the inductance in the d-axis direction, the rotor is first aligned as in the second test, for example, the d-axis of the rotor is in an angle of 90 degrees to the x-axis of the stator reference frame, as shown in FIG. 6.

Next, the current in the quadrature axis direction of the rotor (e.g., in the direction of the x-axis) is increased to a desired value, which can be, for example, the highest value used in practice. The current grows fast with a pulse-like voltage (using only the vector 1) or in a more controlled manner using some simple current control.

Current iq is now at its set value, and the measurement can be started. In the measurement, only voltage vectors 2 and 3 of FIG. 4 are used. When the vectors 2 and 3 are used, the voltage is constant in the d-direction. Current rises rapidly in the d-axis direction, and the current in the direction of the q-axis is kept constant by balancing the voltage vectors 2 and 3. A controller is needed for keeping the q-axis current constant. This controller selects the switching times of the vectors 2 and 3 depending on the magnitude of the q-axis current. A simple PI controller can be used in controlling the q-axis current.

Data is gathered similarly as in the previous test sequences. Voltages and currents in the direction of the y-axis of the stator reference frame are measured. The fluxes are calculated using the gathered data (iy, uy) by using equation 3, for example. When the calculated flux is divided by corresponding currents, the lower inductance curve of FIG. 2 is obtained.

In the next measurement phase, inductance in the q-direction is determined with cross saturation. The procedure is similar to that of the above. The rotor is now turned prior to the measurement such that the d-axis of the rotor is aligned with the x-axis of the stator reference frame as in FIG. 5. DC current is controlled in the direction of the d-axis, and the voltage pulse is fed in the q direction. With respect to the stator, the pulses are similar as in the previous test. The voltages and currents are sampled in the direction of the y-axis of the stator reference frame, and inductance is calculated from the flux calculated from the stored voltages and currents. The obtained inductance curve is shown as the lower curve in FIG. 3.

As mentioned above, the rotor of the reluctance machine is turned to a known angle, or the angle of the rotor is determined prior to the test sequence. If the rotor position is known, the above procedure can be carried out such that the rotor is not turned at all. In that case, the voltage vectors used during the test are combinations of adjacent vectors, making the procedure slightly more complicated.

In the above procedure, the inductances are determined as a function of current. In accordance with an exemplary embodiment, it is also possible to determine the inductances as a function of flux. The difference to the above is that during the cross saturation tests, instead of d- and q-axis currents, d- and q-axis fluxes are kept constant. First, a flux reference is selected and the produced flux is compared with the selected reference. The produced flux is calculated using equation (3) during the test and on the basis of the comparison, voltage vectors are changed as in the case of current references. In this modification, currents and voltages are measured as in the case of current-based determination.

In the above-described method, the whole saturation behavior of a synchronous reluctance machine can be determined. Since the obtained inductances are presented as a function of current throughout the applicable current range, the inductances of the machine can be determined and stored at any current. The inductances that can be determined from the measurements include the synchronous inductances and transient inductances in the d-direction and the q-direction both with and without cross saturation. Further, the amount of cross saturation used in the measurements can be selected, and there can be more than one cross saturation test in each direction with a differing saturation.

Iron losses, for example, eddy currents and hysteresis losses, of the synchronous reluctance motor distort the measured results. For instance, iron losses accelerate the rise of the current during the test pulse. However, in modern AC motors these losses are rather small.

FIG. 7 shows a graph obtained from a pulse test, in which flux values obtained during the inductance measurement are plotted as a function of measured current. Now the synchronous inductance is the slope of the line that is drawn from the origin to a selected point of the curve, e.g., to a point, the inductance of which is of interest. The transient inductance can be obtained from the measurements as the derivative of flux as a function of current at a given operating point.

As illustrated in FIG. 7, synchronous inductance with a certain current is calculated by dividing the obtained flux by current. Fluxes and currents were determined in the test procedures of the present disclosure. The obtained synchronous inductance and current values can be stored in a non-transitory memory (e.g., a non-volatile computer-readable recording medium) for later use, and/or a mathematical inductance model can be built based on measurements of the method. If inductance and current data are stored, the control system can determine the inductances in a certain operating point by using look-up tables, for example. If a mathematical inductance model is constructed for Ld(id,iq) and Lq(id,iq), parameters of the selected modeling functions are tuned by using some appropriate curve fitting method.

The calculation of a derivative giving the transient inductance can be carried out on the basis of successive points from the determined flux values. The most straightforward way is to fit a line to the point of interest by using successive data points and then to calculate the slope of the curve. These values can be stored to look-up tables, or transient inductances can be calculated analytically by using a mathematical model built for synchronous inductances.

The used time step in the measurement of currents and voltages should be small, as the accuracy of the calculation improves with smaller steps. Since the current rises quite rapidly, it is also advantageous to use small time steps so that the voltage pulse can be stopped in good time before the current exceeds a limit value, which makes the inverter or the frequency converter to trip.

The arrangement of the disclosure includes means which are adapted to carry out the method of the disclosure. For example, the means are formed of or are a part of a system that is able to control the rotation of the synchronous reluctance machine. Such a system is, for example, a frequency converter, which includes measurement circuits for measuring currents and DC-link voltage, a processor configured to carry out the required calculations, and accessible non-transitory computer-readable recording medium (e.g., a non-volatile memory), in which the measured and calculated data may be stored and from which the data and the calculated values can be read (see FIG. 8). The non-transitory computer-readable recording medium can also have stored thereon a computer program which causes the processor to carry out the operative functions as described herein. In accordance with an exemplary embodiment, the processor is provided in a computer processing device, and the processor may be a general purpose processor or an application-specific processor. In accordance with an exemplary embodiment, the procedure of the disclosure can be carried out in an automated manner. The operator of the frequency converter initiates the procedure, and once the measurements are carried out, the inductance values are stored in the memory. The procedure may ask the operator for the reference values for the cross saturation tests, or, as default the procedure uses predetermined reference values.

It will be obvious to a person skilled in the art that, as the technology advances, the inventive concept can be implemented in various ways. The disclosure and its embodiments are not limited to the examples described above but may vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of determining inductances of a synchronous reluctance machine, comprising:
    supplying a voltage pulse in the quadrature-axis or direct-axis direction of a rotor;
    sampling currents generated by the supplied voltage pulse;
    calculating values of flux at instants of the sampling from the value of the supplied voltage pulse, values of the sampled current, and a value of a stator resistance;
    calculating at least one of (i) a synchronous inductance of the machine by dividing the calculated flux values by the corresponding sampled currents, and (ii) a transient inductance of the machine as a derivative of the flux with respect to current; and
    storing the calculated values as a function of current.

2. A method according to claim 1, comprising:
    determining a position of the rotor before determining the inductances of the machine.

3. A method according to claim 1, comprising:
    fitting the calculated synchronous inductances to a function, which gives the values of the synchronous inductances as a function of current.

4. A method according to claim 3, wherein the transient inductance is calculated as a derivative of the function, which gives the values of the synchronous inductances as a function of current.

5. A method according to claim 1, comprising:
    turning the rotor of the machine to a known position before determining the inductances of the machine.

6. A method according to claim 5, wherein the known position is the direction of the x or y axis of the stator.

7. A method according to claim 1, comprising:
    magnetizing the rotor in a direction perpendicular to a direction of the voltage pulse before supplying the voltage pulse in the quadrature-axis or direct-axis direction of the rotor for obtaining inductance values with cross saturation.

8. A method according to claim 7, wherein the magnetization comprises:
    selecting a current reference for cross magnetization;
    supplying voltage in a selected direction;
    measuring current produced by the voltage; and
    controlling the current to the current reference for the duration of a pulse test.

9. A method according to claim 8, comprising:
    determining a position of the rotor before determining the inductances of the machine.

10. A method according to claim 8, comprising:
    fitting the calculated synchronous inductances to a function, which gives the values of the synchronous inductances as a function of current.

11. A method according to claim 10, wherein the transient inductance is calculated as a derivative of the function, which gives the values of the synchronous inductances as a function of current.

12. A method according to claim 8, comprising:
    turning the rotor of the machine to a known position before determining the inductances of the machine.

13. A method according to claim 12, wherein the known position is the direction of the x or y axis of the stator.

14. A method according to claim 7, wherein the magnetization comprises:
    selecting a flux reference for the cross magnetization;
    supplying voltage in a selected direction;
    measuring current produced by the voltage;

calculating the flux caused by the voltage from the value of the supplied voltage pulse, the sampled current values and the value of the stator resistance; and controlling the flux to the flux reference for the duration of the pulse test.

15. A method according to claim 14, comprising:

determining a position of the rotor before determining the inductances of the machine.

16. A method according to claim 4, comprising:

fitting the calculated synchronous inductances to a function, which gives the values of the synchronous inductances as a function of current.

17. A method according to claim 16, wherein the transient inductance is calculated as a derivative of the function, which gives the values of the synchronous inductances as a function of current.

18. A method according to claim 14, comprising:

turning the rotor of the machine to a known position before determining the inductances of the machine.

19. A method according to claim 18, wherein the known position is the direction of the x or y axis of the stator.

20. An arrangement of determining inductances of a synchronous reluctance machine, the arrangement comprising:

means for supplying a voltage pulse in the quadrature-axis or direct-axis direction of a rotor;

means for sampling currents generated by the supplied voltage pulse;

means for calculating values of flux at instances of the sampling from the value of the supplied voltage pulse, values of the sampled current, and a value of a stator resistance;

means for calculating at least one of (i) a synchronous inductance of the machine by dividing the calculated flux values by the corresponding sampled currents, and (ii) a transient inductance of the machine as a derivative of the flux with respect to current; and means for storing the calculated values as a function of current.

21. A non-transitory computer-readable recording medium having a computer-readable program recorded thereon that causes a processor of a computer processing device to determine inductances of a synchronous reluctance machine, the program causing the processor to carry out operations comprising:

supplying a voltage pulse in the quadrature-axis or direct-axis direction of a rotor;

sampling currents generated by the supplied voltage pulse;

calculating values of flux at instants of the sampling from the value of the supplied voltage pulse, values of the sampled current, and a value of a stator resistance;

calculating at least one of (i) a synchronous inductance of the machine by dividing the calculated flux values by the corresponding sampled currents, and (ii) a transient inductance of the machine as a derivative of the flux with respect to current; and storing the calculated values as a function of current.

* * * * *